(12) United States Patent
Ulzega et al.

(10) Patent No.: US 8,963,546 B2
(45) Date of Patent: Feb. 24, 2015

(54) METHOD FOR NMR SPECTROSCOPY

(75) Inventors: Simone Ulzega, Duebendorf (CH);
Veronika Vitzthum, Pully (CH);
Geoffrey Bodenhausen, Paris (FR);
Marc Anthony Caporini, Cambridge, MA (US)

(73) Assignees: Bruker BioSpin AG, Faellanden (CH);
Ecole Polytechnique Fédéral de Lausanne (EPFL), Lausanne (CH)

( * ) Notice: Subject to any disclaimer, the term of this patent is extended or adjusted under 35 U.S.C. 154(b) by 421 days.

(21) Appl. No.: 13/402,897

(22) Filed: Feb. 23, 2012

(65) Prior Publication Data

US 2012/0229137 A1 Sep. 13, 2012

(30) Foreign Application Priority Data

Mar. 9, 2011 (EP) .................................... 11157398

(51) Int. Cl.
*G01V 3/00* (2006.01)
*G01R 33/46* (2006.01)

(52) U.S. Cl.
CPC ........ *G01R 33/4641* (2013.01); *G01R 33/4616* (2013.01); *G01R 33/4633* (2013.01)
USPC .......................................................... 324/309

(58) Field of Classification Search
USPC ................................................. 324/300–322
See application file for complete search history.

(56) References Cited

U.S. PATENT DOCUMENTS

| | | | | |
|---|---|---|---|---|
| 4,254,373 A | * | 3/1981 | Lippmaa et al. | 324/321 |
| 4,654,593 A | * | 3/1987 | Ackerman | 324/307 |
| 5,099,206 A | * | 3/1992 | Imaizumi et al. | 324/307 |
| 5,117,186 A | * | 5/1992 | Burum et al. | 324/307 |
| 5,208,536 A | * | 5/1993 | Cory | 324/321 |
| 5,886,525 A | * | 3/1999 | Yesinowski et al. | 324/321 |
| 7,081,753 B2 | * | 7/2006 | Mullen et al. | 324/318 |

(Continued)

FOREIGN PATENT DOCUMENTS

| | | |
|---|---|---|
| JP | 07-260720 | 10/1995 |
| WO | WO 97/14814 | 4/1997 |

OTHER PUBLICATIONS

Feike M., "Broadband multiple-Quantum NMR Spectroscopy", Journal of Magnetic Resonance, Series A, Academic Press, Orlando, FL,US,vol. 122, No. 2, Oct. 1, 1996, pp. 214-221.

(Continued)

*Primary Examiner* — Dixomara Vargas

(74) *Attorney, Agent, or Firm* — Paul Vincent

(57) ABSTRACT

A method for performing magnetic resonance spectroscopy on solid samples containing nuclei of interest with spin quantum number I subjects the sample to a static magnetic field. The sample is spun at the magic angle and broad-band excitation of transverse magnetization of the nuclei of interest is effected by applying a first train of rotor-synchronized rf-pulses, having a carrier frequency, to the nuclei of interest with a pulse duration $0.1~\mu s < \tau_p < 2~\mu s$, the first train of rf-pulses comprising k·n pulses extending over k rotor periods $\tau_{rot}$ with n pulses per rotor period $\tau_{rot}$, wherein n is an integer n>1. Uniform excitation of a great number of spinning sidebands or families of sidebands that arise from large first-order quadrupole or hyperfine interactions is enabled and signal intensity is thereby improved.

15 Claims, 6 Drawing Sheets

(56) References Cited

U.S. PATENT DOCUMENTS

| | | | |
|---|---|---|---|
| 7,439,738 B2* | 10/2008 | Pines et al. | 324/307 |
| 7,535,224 B2* | 5/2009 | Hu et al. | 324/307 |
| 8,064,982 B2* | 11/2011 | Hu et al. | 600/410 |

OTHER PUBLICATIONS

Cavadini S., "Indirect detection of nitrogen-14 in solid-state NMR spectroscopy", Chemphyschem Wiley-VCH Verlag GmbH, Germany, vol. 8, No. 9, Sep. 2007, pp. 1363-1374.

Caravatti P. et al., "Selective pulse experiments in high-resolution solid state NMR", Journal of Magnetic Resonance, Academic, Press, London, GB, vol. 55, No. 1, Oct. 15, 1983, pp. 88-103.

Wu C. L. et al., "Proton high-resolution magic angle spinning NMR analysis of fresh and previously frozen tissue of human prostate", Magnetic Resonance in Medicine Wiley USA, vol. 50, No. 6, Dec. 2003, pp. 1307-1311.

G. Bodenhausen et al., "A Simple Pulse Sequence for Selective Excitation in Fourier Transform NMR", J. Magn. Reson. 23 (1976) 171.

Cavadini S., et al., "Nitrogen-14 NMR Spectroscopy Using Residual Dipolar Splittings in Solids", J. A. Chem. Soc. 128, (2006) 7706.

Gan Z. "Measuring Amide Nitrogen Quadrupolar Coupling by High-Resolution $^{14}N/^{13}C$ NMR Correlation under Magic-Angle Spinning", J. Chem. Soc. 128 (2006) 6040.

\* cited by examiner rectangular pulse

DANTE
1 pulse / rotor period overtone DANTE
2 pulses / rotor period overtone DANTE
4 pulses / rotor period overtone DANTE
8 pulses / rotor period

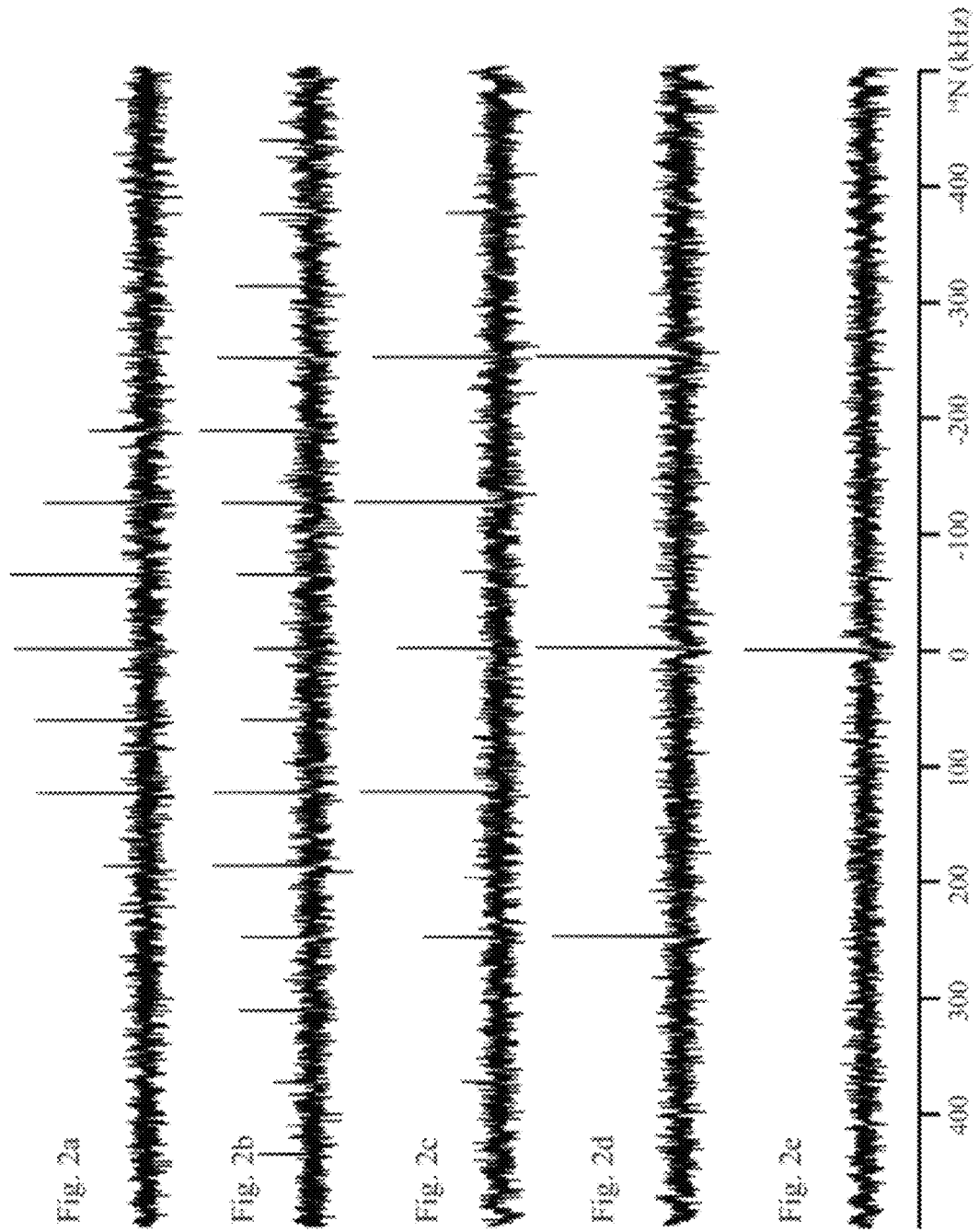

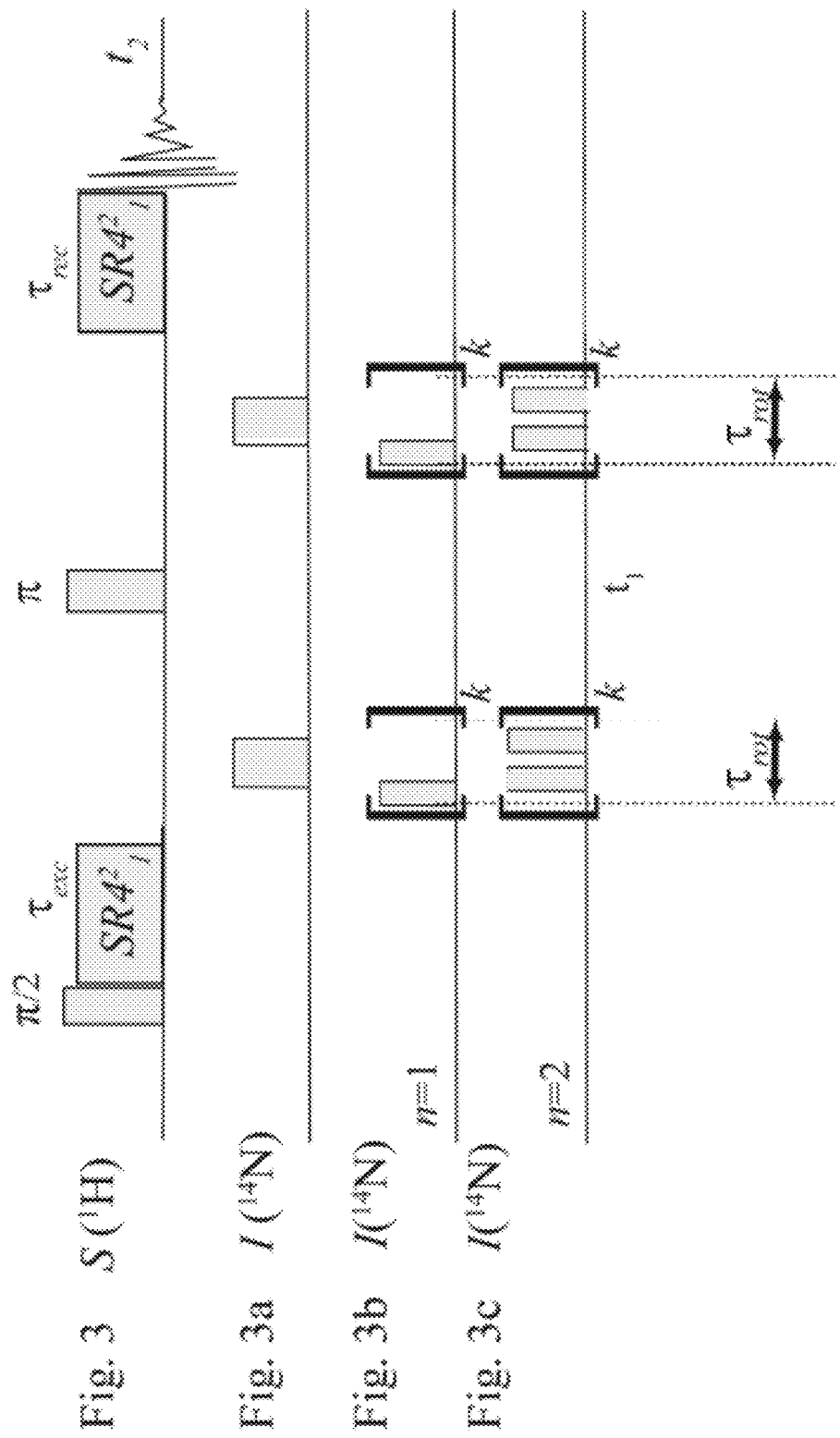

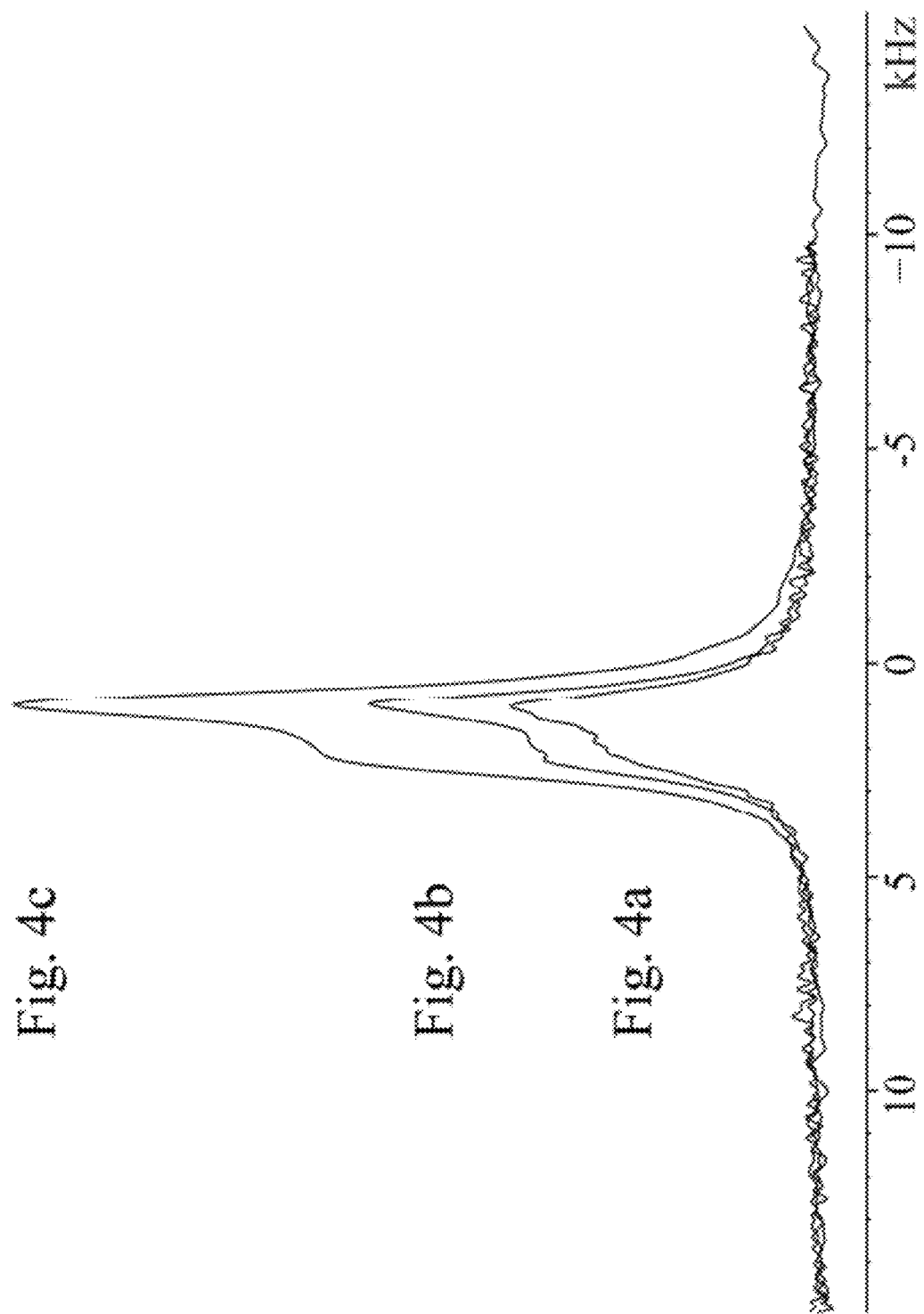

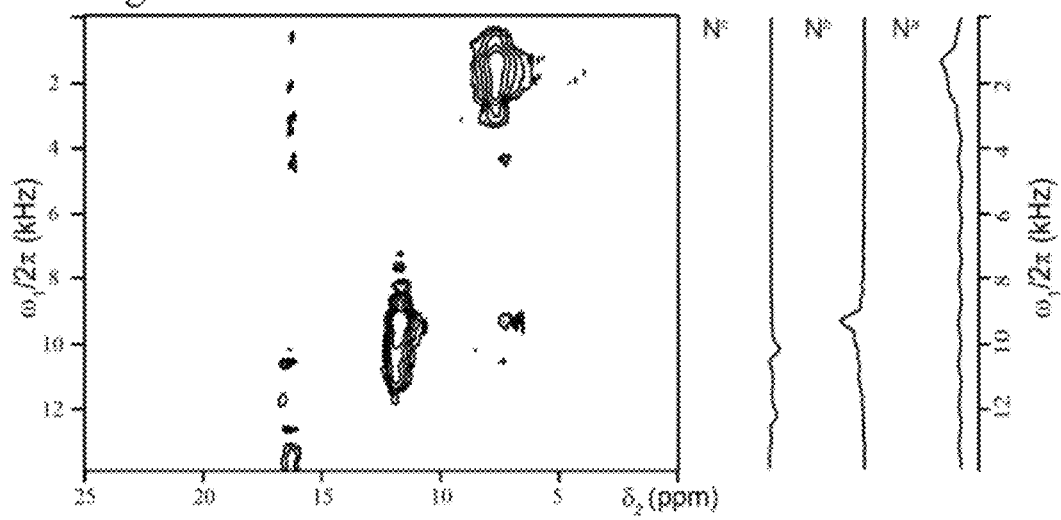

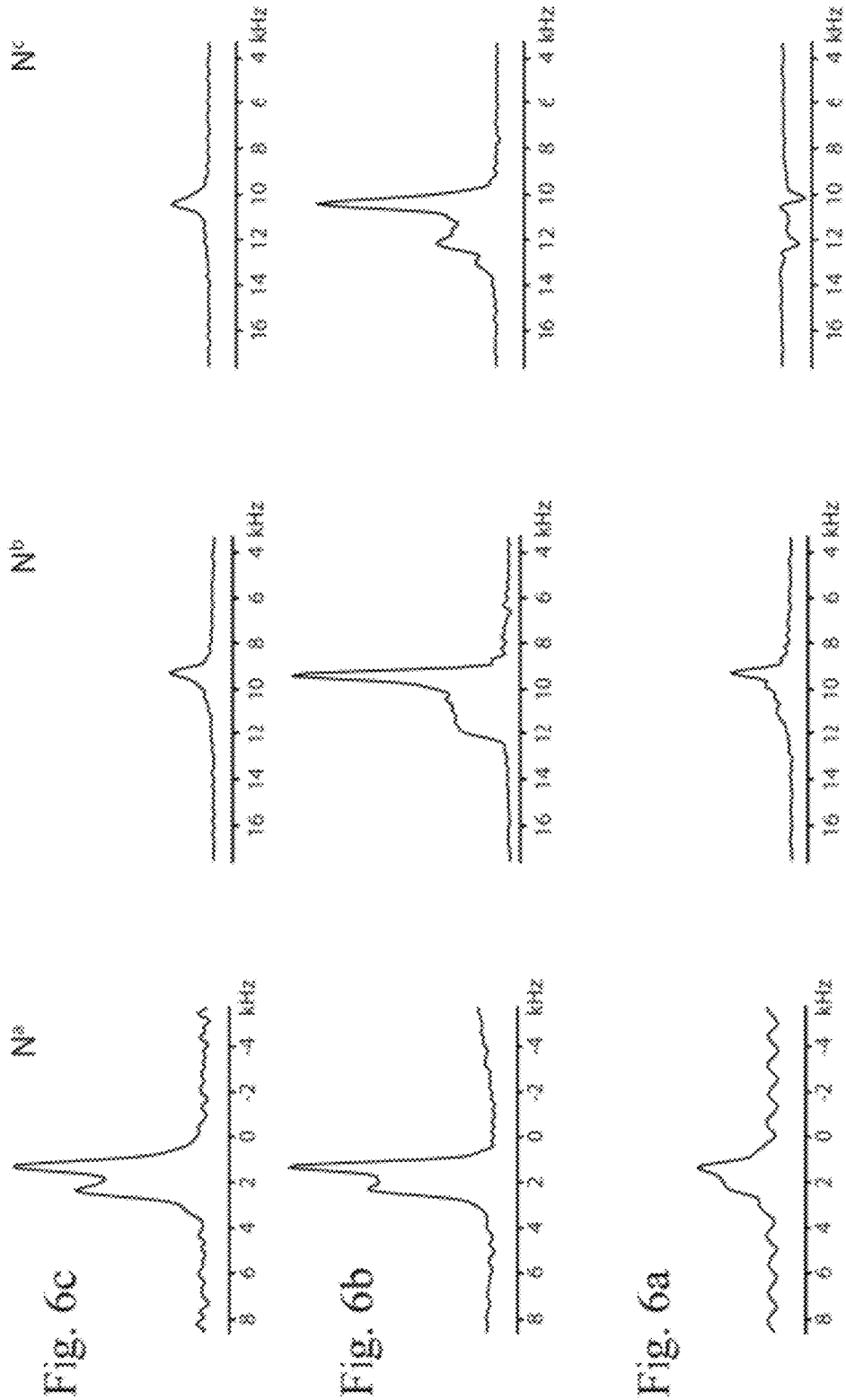

METHOD FOR NMR SPECTROSCOPY

This application claims Paris Convention priority of EP 11 157 398.6 filed Mar. 9, 2011 the complete disclosure of which is hereby incorporated by reference.

BACKGROUND OF THE INVENTION

The invention concerns a method for performing magnetic resonance spectroscopy on solid sample containing nuclei of interest with spin quantum number I, comprising: subjecting the sample to a static magnetic field, spinning the sample at the magic angle and broad-band excitation of transverse magnetization of the nuclei of interest.

Related methods are known from [6].

Nitrogen plays structural and functional roles of fundamental importance in proteins and nucleic acids that are essential to many processes in living organisms. Nitrogen-14 is potentially an attractive spectroscopic probe because of its favorable isotopic abundance (99.6%) and reasonable gyromagnetic ratio (~70% of $^{15}N$). However, $^{14}N$ NMR is not yet a well-established spectroscopic technique. Unlike nuclei with spin S=½ such as $^{13}C$ and $^{15}N$, $^{14}N$ has a spin I=1 and a nuclear quadrupole moment Q. The interaction of $^{14}N$ nuclei with local electric field gradients is characterized by a quadrupole coupling constant $C_Q$ which can be as large as ~1-3 MHz. In static powders or crystals, this leads to spectra with a width of several MHz which are difficult to excite uniformly and require broad probe and receiver bandwidths, thus limiting the sensitivity of the experiments. This problem also arises with other nuclei having a nuclear quadrupole moment Q as well as with paramagnetic samples where the spectra of the nuclei are broadened by hyperfine interactions with unpaired electrons.

In solid-state NMR, the first-order components of second-rank tensor interactions (e.g., dipolar couplings, anisotropic chemical shifts and quadrupole interactions) can be averaged out by magic angle spinning (MAS). Nevertheless, even with very fast spinning ($v_{rot}$>50 kHz), $^{14}N$ MAS NMR spectra are characterized by a large number of spinning sidebands [1], the envelope of which critically depends on several parameters [2].

In [3-5] application of trains of short pulses are disclosed (DANTE—Delay Alternating with Nutation for Tailored Excitation). In [5] DANTE sequences are used with MAS for selective inversion of a specific sideband family arising from one spin species (i.e. arising from the same sort of nuclei and having the same chemical shift) and selective excitation of a single spinning sideband.

It has been shown in recent years [6-7] that reliable $^{14}N$ spectra can be obtained through indirect detection via a spy nucleus (typically $^1H$ or $^{13}C$) in the manner of heteronuclear single- and multiple-quantum correlation spectroscopy (HSQC and HMQC). So far, these methods have relied on the use of rectangular rf pulses applied in the center of the nitrogen spectrum to excite heteronuclear multiple-quantum coherences comprising $^{14}N$ single- or double-quantum (SQ or DQ) transitions and to reconvert these coherences back into observable single-quantum (SQ) coherences of the spy nuclei. The duration $\tau_p$ of the rectangular excitation and reconversion pulses applied to the $^{14}N$ channel can be adjusted empirically, typically in the range 0.3 $\tau_{rot}$<$\tau_p$<0.6 $\tau_{rot}$. The efficiency of the coherence transfer process depends critically on the optimization of these pulses [2].

It is an object of the present invention to propose a method for performing magnetic resonance spectroscopy using MAS which enables uniform excitation of a great number of spinning sidebands and families of spinning sidebands with different chemical shifts that arise from large first-order quadrupole or hyperfine interactions.

It is a further object of the invention to improve signal intensity.

SUMMARY OF THE INVENTION

These objects are solved by a method according to the independent claim. According to the invention the broad-band excitation is carried out by applying a first train of rotor-synchronized rf-pulses (of rotor-synchronized DANTE sequence) with a carrier frequency to the nuclei of interest with a pulse duration 0.1 μs<$\tau_p$<2 μs, the first train of rf-pulses comprising k·n pulses extending over k rotor periods $\tau_{rot}$ with n pulses per rotor period $\tau_{rot}$, where n is an integer n>1.

Excitation means the transfer from longitudinal to transverse magnetization of the spins of the nuclei of interest. The excitation of the transverse magnetization of the nuclei of interest is carried out while the sample is subjected to the static magnetic field.

The DANTE sequence used in the inventive method is rotor-synchronized, i.e., n equally spaced pulses are applied during each rotor period $\tau_{rot}$=1/$v_{rot}$. A DANTE sequence in which n>1 pulses are applied during each rotor period $\tau_{rot}$ is called 'overtone' DANTE sequence. The use of an 'overtone' DANTE sequence leads to the suppression of spinning sidebands except those at $v_0 \pm n v_{rot}$. The length $\tau_{train}$ of the 'overtone' DANTE sequence (pulse train) is shortened by a factor n compared to a 'basic' DANTE sequence (n=1). This reduces signal losses due to decay and thus enhances the signal intensity. The shorter the length $\tau_{train}$ of the pulse train the better the intensity of the signal. Thereby the inventive method allows one, e.g., to sample the indirect time domain $t_1$ of a 2D NMR measurement at dwell times equal to the rotor period/n instead of only the rotor period. Thereby significant gains in signal to noise can be achieved by collecting more points before the signal decays due to relaxation. In the indirect time domain $t_1$ the sidebands are folded in such a way to constructively add by synchronizing the dwell time of the indirect dimension with the rotor period divided by n.

The length $\tau_{train}$ of the pulse train determines the width $1/\tau_{train}$ of the sidebands in the Fourier transform of said pulse train and thus the range of offsets of the spin species which can be excited by said pulse train. By using the inventive overtone DANTE sequence some of the spinning sidebands are suppressed and the spectral width can be increased thereby facilitating excitation in a broadband manner. In the inventive method the DANTE-sequence is preferably used for exciting multiple spin species that give rise to multiple families of sidebands. This can be achieved by using a pulse train of length $\tau_{train}$ that is shorter by a factor n compared to the length of a pulse train with n=1 which may be used for selective excitation of only one spin species, thereby broadening the sidebands of the rf-irradiation spectrum.

The inventive method results in an NMR-spectrum, in particular in a 1D or 2D spectrum. The nuclei of interest may comprise one or several species of the same sort of nuclei in different molecular environments, whereby different species of a nucleus differ in chemical shift, i.e. they are chemically inequivalent. Thus excitation of transverse magnetization of multiple species of one sort of nuclei and their corresponding spinning side band-families can be realized in a broadband manner, i.e. with a bandwidth larger than the radio-frequency intensity, in practice at least 10 kHz, preferably >100 kHz, normally <1 MHz. The bandwidth is most likely limited by the tuning of the probe.

The resonance signals arising from the afore described excitation can be detected with conventional NMR detection methods, thereby resulting in one or multidimensional NMR-spectra.

In a preferred variant of the inventive method the pulse duration $\tau_p$ is equal for all k·n pulses of the first train of pulses.

The inventive method is advantageous for examining samples containing nuclei showing broad spectra as stated in the description of the background of the invention. In preferred variant the nuclei of interest are nuclei with a nuclear quadrupolar moment with spin quantum number I=1, such as 14N or 2D.

Alternatively the nuclei of interest are quadrupolar nuclei with spin quantum number I=3/2 or 5/2 or 7/2.

The inventive method is also advantageous if the nuclei of interest have spin quantum number I=½, such as 13C or 15N, in particular comprised in paramagnetic samples, where the spectra of the nuclei of interest are broadened by hyperfine interactions with unpaired electrons.

It is advantageous that a reconversion of transverse magnetization into longitudinal magnetization is carried out by applying a second train of short rotor-synchronized rf-pulses, whereby the first train and the second train are separated by a variable evolution interval $t_1$. Reconversion means the transfer from transverse to longitudinal magnetization of the spins of the nuclei of interest and is carried out while the sample is subjected to said static magnetic field.

If the evolution interval is incremented it yields 2D spectra. If the evolution interval is not incremented 1D spectra of spy nuclei filtered through nuclei of interest can be achieved (e.g. 14N-filtered 1D spectra of S nuclei 1H or 13C), in case of a indirect excitation (see below).

In a preferred variant the first and the second train are equal with respect to the number n·k of pulses, the number k of rotor periods, the number n of pulses per rotor period and pulse duration $\tau_p$.

In a special variant of the inventive method the excitation of the nuclei of interest by the first train of short rotor-synchronized rf-pulses is carried out after: excitation of transverse magnetization from spy nuclei with spin quantum number S=½, in particular by using cross-polarization from protons 1H to the spy nuclei such as 13C, and an excitation interval $\tau_{exc}$, either without applying rf-irradiation, or with applying a multiple-pulse recoupling sequence to recouple the dipolar interactions between spy nuclei S and the nuclei of interest I, whereby the first train of short rotor-synchronized pulses is applied with a suitable carrier frequency immediately after the excitation interval $\tau_{exc}$. It is preferred to use 1H or 13C as spy nuclei. Typically, the number k of short pulses in k·$\tau_{rot}$ is chosen such that the length $\tau_{train}$ of the DANTE sequences are much longer than the rectangular excitation and reconversion pulses that were used hitherto in most indirect detection experiments. The recoupling allows the build-up of coherence of spin S in antiphase with respect to spin I. If no recoupling sequence is applied, the build-up of coherence of spin S in antiphase with respect to spin I can occur under the combined effects of scalar J-couplings and residual dipolar splittings. By applying the first train of short rotor-synchronized pulses heteronuclear multiple-quantum coherences comprising the nuclei of interest are excited (antiphase coherences are transferred into heteronuclear coherences).

It is preferred that following the second train of rotor-synchronized rf-pulses the reconversion of the magnetization of the nuclei of interest comprises a reconversion interval $\tau_{rec}$.

The evolution interval $t_1$ can be incremented, in particular in steps $\tau_{rot}/n$, in the manner of heteronuclear single- or multiple-quantum two-dimensional correlation spectroscopy.

The evolution interval $t_1$ is preferably split into two equal intervals by a refocusing 180° rf-pulse applied to the S spins of the spy nuclei in order to refocus the frequency offset of the S spins of the spy nuclei with respect to the rf carrier frequency. The first and the second train are applied symmetrically with respect to the refocusing pulse, i.e., the time interval between end of first train and the center of the refocusing pulse is equal in duration to the time interval between the center of the refocusing pulse and beginning of the second train.

It is advantageous when the durations of the two halves of the split interval $t_1$ are incremented in steps of $\tau_{rot}/2n$ to achieve a greater bandwidth in the indirect dimension and reduce losses due to signal decay in the interval $t_1$.

Further advantages can be extracted from the description and the enclosed drawings. The features mentioned above and below can be used in accordance with the invention either individually or collectively in any combination. The embodiments mentioned are not to be understood as exhaustive enumeration but rather have exemplary character for the description of the invention.

The invention is shown in the drawing:

BRIEF DESCRIPTION OF THE DRAWING

FIG. 1a shows a rectangular pulse;

FIG. 1b shows a 'basic' DANTE scheme with k=8 (only 5 of which are shown) rotor-synchronized pulses; FIGS. 1c to 1e show 'overtone' DANTE sequences with n=2 (c), 4 (d), and 8 (e) pulses per rotation period $\tau_{rot}$. The use of overtone DANTE sequences results in shortening of the train duration $\tau_{train}$=k·$\tau_{rot}$·1/n.

FIGS. 2a to 2e show excitations profiles for direct excitation and observation of 14N magnetization in polycrystalline glycine spinning at $v_{rot}$=62.5 kHz (rotation period $\tau_{rot}$=16 μs), whereby:

FIG. 2a shows a single rectangular pulse of duration $\tau_p$=3.5 μs and rf amplitude $\omega_1$(14N)/(2π)=$v_1$(14N)=60 kHz (calibrated for NH$_4$Cl which has a very small quadrupolar coupling constant) was used for excitation. The envelope of the higher-order spinning sidebands is severely distorted;

FIG. 2b shows a 'basic' DANTE scheme with n=1 and k=13 rotor-synchronized pulses of $\tau_p$=0.5 μs duration each in a total time 13$\tau_{rot}$=208 μs was used for excitation;

FIGS. 2c to 2e show 'overtone' DANTE sequences with n=2 (c), 4 (d), and 8 (e) pulses per rotation period $\tau_{rot}$ are used for excitation. The use of overtone DANTE sequences results in the failure to excite sidebands that do not coincide with the Fourier components of the DANTE sequence at $v=v_{rf}\pm kv_{rot}$ (as if the effective spinning frequency were multiplied by a factor k) while the amplitude of the even sidebands is boosted.

FIG. 3: shows schemes for the indirect detection of 14N nuclei I=1 via spy nuclei S=½ (here protons) by heteronuclear multiple-quantum correlation (HMQC) in solids spinning at the magic angle. In the interval $\tau_{exc}$=p$\tau_{rot}$ (p is a positive integer), a recoupling sequence such as SR4$^2_1$ introduces a heteronuclear dipolar 1H-14N coupling to allow for the creation of antiphase terms $T^S_{1,m}T^I_{2,0}$ and $T^S_{1,m}T^I_{1,0}$ with m=±1. These can be transformed into heteronuclear coherences $T^S_{1,m}T^I_{2,m'}$ and $T^S_{1,m}T^I_{1m'}$ with m=±1 and m'=±1 or ±2 using one of the following three methods:

FIG. 3a shows a rectangular pulse with an rf amplitude on the order of $\omega_1$(14N)/(2π)=60 kHz and a duration of 0.1 $\tau_{rot}$ <$\tau_p$ <0.6 $\tau_{rot}$, as in earlier work (here, $\tau_p$=11 μs and $\tau_{rot}$=16 μs).

FIG 3b shows a 'basic'-DANTE sequence (i.e., n=1 pulse per rotor period) with k short rotor-synchronized pulses with a typical duration $\tau_p$=0.5 µs each and a typical rf amplitude $\omega_1(^{14}N)/(2\pi)$=60 kHz.

FIG. 3c shows an 'overtone' DANTE sequences with n pulses per rotation (shown as n=2) according to the invention.

FIGS. 4a to 4c show cross-sections taken from 2D spectra of glycine, spinning at $\nu_{rot}$=31.25 kHz in a static field of 18.8 T (800 MHz for protons).

FIG. 4a shows a conventional HMQC sequence using rectangular pulses with $\omega_1(^{14}N)/(2\pi)$=60 kHz and $\tau_p$=18.3 µs.

FIGS. 4b and 4c show an 'overtone' DANTE HMQC sequence with n=2 and k=2, i.e., n.k=4 pulses of duration $\tau_p$=1.5 µs each applied in $2\tau_{rot}$=64 µs. FIG 4b: $t_1$ is sampled with increments $\Delta t_1 = \tau_{rot}$ leading to a spectral width of $\nu_{rot}$, while FIG 4c: $t_1$ is oversampled with increments $\Delta t_1 = \frac{1}{2}\tau_{rot}$ and spectral width of $2\nu_{rot}$. Oversampling the 2D spectrum (c) leads to a dramatic increase in signal-to-noise ratio.

FIGS. 5a and 5b show two-dimensional (2D) spectra of polycrystalline histidine spinning at $\nu_{rot}$=62.5 kHz in a static field of 18.8 T (800 MHz for protons), showing correlations of single-quantum (SQ) $^{14}N$ signals with those of neighboring protons.

FIG.5a shows a conventional HMQC sequence of FIG. 3(a) using rectangular pulses with $\omega_1(^{14}N)/(2\pi)$=60 kHz and $\tau_p$=11 µs.

FIG. 5b shows an 'overtone' DANTE HMQC sequence of FIG. 3(c) with n=2 and k=2, i.e., n.k=4 pulses of duration $\tau_p$ =1.1 µs each applied in $2\tau_{rot}$=32 µs.

FIGS. 6a to 6c show projections of the cross-peaks taken from the 2D HMQC spectra of FIG. 5 parallel to the $\omega_1$ axis of the signals of nuclei $N^a$, $N^b$, and $N^c$ in histidine.

FIG. 6a shows the conventional HMQC sequence of FIG. 3a.

FIG. 6b shows the 'basic' DANTE sequence of FIG. 3b with n=1 and k=8, i.e., n.k=8 pulses of $\tau_p$ =0.7 µs each in $8\tau_{rot}$=128 µs.

FIG. 6c shows the 'overtone' DANTE sequence of FIG. 3c with n=2 and k=2, i.e., n.k=4 pulses of $\tau_p$ =1.1 µs each in $2\tau_{rot}$=32 µs.

DESCRIPTION OF THE PREFERRED EMBODIMENT

FIG. 1 shows different possibilities for exciting a number of families of spinning sidebands that arise from large first-order quadrupole or hyperfine interactions. In the inventive method a conventional rectangular rf-pulse of duration $\tau_p$, which is known from the state of the art, is replaced with a DANTE sequence, i.e. with a train of k·n pulses within k rotor periods of n pulses per rotor period with pulse duration $\tau_p$. In the examples shown in FIG. 1b-e each train comprises 8 rf-pulses (due to shortage of space only 5 of 8 rotor periods are shown in FIG. 1b).

Figure 1A:
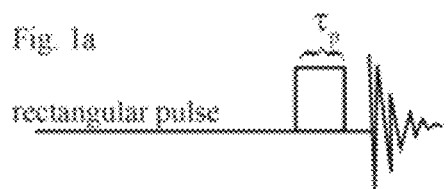
FIGS. 1a to 1e show excitation pulses for exciting transverse magnetization.
Figure 1B:
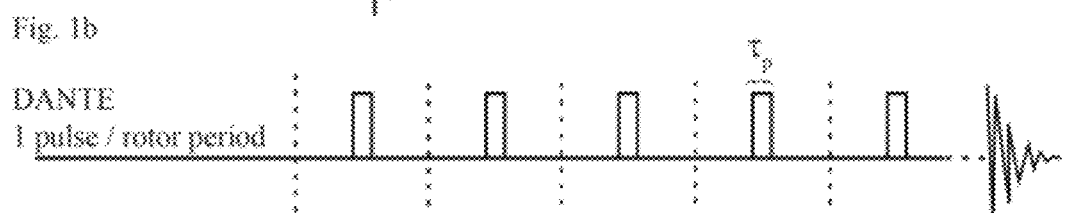

FIG. 1b shows a 'basic' DANTE sequence with n=1 pulse per rotor period. It should be noted that the number of pulses of the train given in the example is only exemplary. In practice the number of pulses per train is chosen such that a desired flip angle of the spin of the nuclei of interest is achieved by irradiating the DANTE sequence.

Figure 1C:
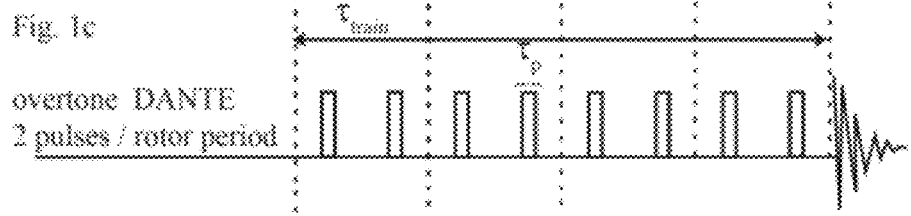
Figure 1D:
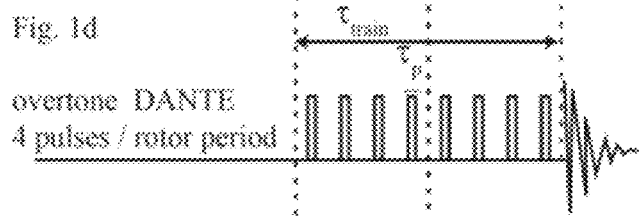
Figure 1E:

Instead of k rotor periods with n=1 pulse per rotor period and pulse duration $\tau_p$, an 'overtone' DANTE sequence comprising k/n rotor periods with n pulses per rotor period and pulse duration $\tau_p$ can be applied (FIG. 1c-e). The higher the number n of pulses per rotor period the shorter the train duration is (equal pulse durations and amplitudes assumed) for exciting the nuclei of interest with a given flip angle, thereby increasing the intensity of the signal.

The pulses within a sequence are equally spaced and rotor synchronized. The pulse duration $\tau_p$ may vary from pulse to pulse within a sequence. In most cases however the train comprises pulses of equal pulse length. The sequence is applied in order to excite transverse magnetization of the nuclei of interest. Other pulses that may be applied in order to produce other effects (e.g. inversion or refocusing) are not subjected to the restrictions mentioned in connection with the DANTE sequence.

By exciting transverse magnetization by using an inventive overtone DANTE sequence a great number of spinning sidebands families can be excited more uniformly while signal intensity is enhanced. The inventive method can be applied in one- and multi-dimensional NMR experiments.

FIG. 2 shows excitation profiles that can be achieved by direct excitation and detection of $^{14}N$ using either a single rectangular pulse, a basic rotor-synchronized DANTE method with n=1, or 'overtone' DANTE sequences with n=2, 4, or 8 pulses per rotor period. The receiver bandwidth was set to 1 MHz and the pulse amplitude was calibrated to 60 kHz using ammonium chloride ($NH_4Cl$), which has a negligible quadrupole coupling. For the basic and overtone DANTE sequences, the number k of rotor periods and the pulse length $\tau_p$ were optimized empirically to achieve the largest transverse magnetization. With n=1, the radio-frequency irradiation sidebands of the DANTE sequence coincide with the spinning sidebands, provided the carrier frequency coincides with one of the spinning sidebands. With n=2, the radio-frequency irradiation sidebands of the DANTE sequence coincide with even spinning sidebands, provided the carrier frequency coincides with one of the spinning sidebands. With n=4, the radio-frequency irradiation sidebands of the DANTE sequence coincide with every fourth spinning sideband, provided the carrier frequency coincides with one of the spinning sidebands, etc.

FIG. 3 shows schemes for the indirect detection of $^{14}N$. The indirect detection of $^{14}N$ exploits the transfer of coherence between single- or double-quantum (SQ or DQ) coherences of nitrogen-14 and SQ coherences of suitable spy nuclei with spin S=½ such as $^1H$ or $^{13}C$, as described in detail elsewhere [2, 6-12]. It is known that the transfer of coherence can be achieved via residual dipolar splitting (RDS) [2,6], via scalar couplings [7,8] or via heteronuclear dipolar interactions, provided these are 'recoupled' by suitable pulse sequences as described in [10,11].

At the end of the excitation interval $\tau_{exc}$ (see FIG. 3), these interactions lead to a state that can be described by spin tensor product operators $T^S_{1,m}T^I_{2,0}$ and $T^S_{1,m}T^I_{1,0}$, with m±1. At this point, the coherence order for spin I (i.e., $^{14}N$) is still $p_I$=0, whereas for spin S (i.e., $^1H$ or $^{13}C$) one has coherence orders $p_S$±1. In the $^{14}N$ NMR experiments described by Cavadini et al. [2], SQ or DQ coherences of the $^{14}N$ spin I of order $p_I$±1 or $p_I$±2 are created by applying an rf pulse within about 10 kHz of the centre of the quadrupolar doublet of the nitrogen spectrum. These coherences are allowed to evolve freely during the evolution time at the end of which they are symmetrically reconverted back into observable SQ coherences $T^S_{1,m}$ of the spy nucleus. The optimum duration $\tau_p$ of the excitation and reconversion $^{14}N$ pulses depends on the spinning frequency and on the quadrupole coupling constant $C_Q$, and must be optimized experimentally. For a sample of L-alanine ($C_Q$=1.13 MHz) spinning at $\tau_{rot}$=30 kHz using an rf amplitude $\nu_1(^{14}N)$=57 kHz, the optimum [2] is $\tau_p$~11 µs ($\tau_p/\tau_{rot}$~⅓) for $^{14}N$ SQ ($p_I$=±1) and $\tau_p$~22 µs ($\tau_p$~$\tau_{rot}$~⅔) for $^{14}N$ DQ ($p_I$=±2), suggesting a compromise $\tau_p$~16 µs~0.5$\tau_{rot}$ ($\tau_p/$ $\tau_{rot}\sim\frac{1}{2}$). The global excitation-reconversion efficiency was about 16% and 13% for SQ and DQ coherences, respectively.

In the inventive method the rectangular nitrogen-14 pulses of duration $\tau_p$ are replaced with DANTE sequences, i.e., k rotor periods with n pulses per rotor period. In the example shown in FIG. 3 (indirect detection of $^{14}$N via protons) the number of rotor periods is 2<k and the pulse durations are $\tau_p\sim0.7$ μs or shorter. In analogy to a rectangular $^{14}$N pulse, the first DANTE sequence induces heteronuclear MQ coherences involving $^{14}$N SQ and DQ coherences. After the $t_1$ evolution interval, the second DANTE sequence allows one to reconvert these heteronuclear coherences back into the states $T^S_{1,m}T^I_{2,0}$ and $T^S_{1,m}T^I_{1,0}$. The excitation and reconversion DANTE sequences preferably have the same numbers n, k and duration $\tau_p$. Nevertheless the inventive method can be carried out according to the scheme of FIG. 3 with the excitation DANTE sequence having numbers n, k and duration $\tau_p$ different than the reconversion DANTE sequence. The reconversion DANTE sequence can also be replaced by a rectangular pulse.

The phase cycles described by Cavadini et al. [2] allow one to select the desired coherence pathways, i.e., to select $^{14}$N SQ or DQ coherences. In this work only results from the SQ pathway are presented. Yet, the invention can be also used for DQ. The efficiency of the scheme has been optimized by varying both the number k of rotor periods for each DANTE sequence and the duration $\tau_p$ of the individual pulses. Experiments on polycrystalline samples of Glycine and Histidine spinning at $\nu_{rot}$=62.5 kHz and $\nu_{rot}$=31,25 kHz ($\tau_{rot}$=16 μs, $\tau_{rot}$=32 μs) are carried out, in a static magnetic field $B_0$=18.9 T corresponding to a proton Larmor frequency of 800 MHz.

The present invention shows that the conventional rectangular excitation and reconversion pulses (FIG. 3a) at the beginning and end of the evolution time $t_1$ can be replaced by rotor-synchronized DANTE sequences. Typically, with n=1 pulse per rotor period, one may use k=12 short pulses in 12$\tau_{rot}$, so that the DANTE sequences are much longer than the rectangular excitation and reconversion pulses that were used hitherto in most indirect detection experiments. To limit signal decay due to dipolar interactions, DANTE experiments are therefore best carried out at spinning frequencies higher that 30 kHz.

Comparing direct excitation with a single rectangular pulse or with DANTE sequences (FIG. 2a and FIG. 2b) it can be seen that the latter scheme allows one to achieve a much more uniform excitation of many spinning sidebands. 'Overtone' DANTE sequences with n=2, 4 and 8 pulses per rotor period (FIG. 2c-e) lead to spectra where, in addition to the centerband that coincides with the carrier frequency $\nu_{rf}$, only spinning sidebands spaced at $\nu_{rf}\pm n\nu_{rot}$ (where n=2, 4 and 8) appear. It should be noted that the number of pulses per rotation period is not limited to n=2, 4 and 8. Note that 'overtone' DANTE sequences produce sideband patterns (FIG. 2c-e) that are similar to what would be expected if the spinning frequency could be boosted to $n\nu_{rot}$. In the indirect $t_1$ dimension (FIG. 3c), this allows one to oversample by using small increments $\Delta t_1 = \tau_{rot}/n$. This leads to an n-fold increase of the spectral width in the $\omega_1$ domain, and provides a boost in signal-to-noise ratio by acquiring more points before the signal decays, and by spreading the noise across a larger spectrum. This is shown in FIG. 4 where in the $\omega_1$ dimension the spectrum of glycine, spinning at 31.250 kHz, is acquired with the normal HMQC sequence (FIG. 4a) the 'overtone' DANTE (n=2) with normal sampling (FIG. 4b) and with oversampling (FIG. 4c).

Most solid-state NMR spectrometers are not designed to deliver sub-microsecond pulses. In practice, the rising and falling edges of the pulse shapes will be distorted, inter alea because of the high quality Q factors of the probes. Fortunately, it turns out that DANTE sequences are quite forgiving.

The DANTE sequences, in particular overtone DANTE sequences with n>1 which have a short duration $\tau_{train}$=k$\tau_{rot}$ are relatively broadband and can excite several families of sidebands that have one sideband near the carrier frequency, since the widths of the sidebands in the radio-frequency spectrum are proportional to $1/\tau_{train}$. The spectra in FIGS. 5 and 6 indicate that a single DANTE sequence can excite several isotropic shifts spanning at least 10 kHz if the rf amplitude is 60 kHz. The shifts in the N14 dimension are small, and they all fall within the width of a single sideband of the radio-frequency irradiation of the DANTE sequence.

The DANTE approach described above was combined with indirect (proton) detection of $^{14}$N SQ by HMQC. Using a basic rotor-synchronized DANTE scheme (n=1 pulse per rotor period, k=13 rotor periods), the spectra of FIG. 6 show that the gain in the excitation efficiency is sufficient to compensate for the dramatic $T_2$' losses during k=13 rotor periods. It is of advantage to spin the sample at high spinning speeds to reduce the losses in the interval k$\tau_{rot}$. For glycine, which has a small quadrupole interaction $C_Q$=1.18 MHz, the efficiency of the basic DANTE sequence is comparable to an HMQC sequence with rectangular pulses. For the aromatic nitrogen nuclei in histidine, which have larger quadrupolar coupling constants ($C_Q\sim$1-3 MHz), one notices a significant improvement with DANTE (FIG. 5). All three nitrogen sites in histidine $N^a$ (=$NH_{3+}$), $N^b$(=acidic aromatic NH), and $N^c$ (=basic aromatic N) could be excited and resolved in the indirect dimension, while in the conventional HMQC spectrum only the $N^a$ resonance, which has the smallest quadrupole interaction, could be excited. The improvement of the excitation is illustrated in FIG. 6 by comparing cross-sections through the 2D spectra of FIG. 5. Note the dramatic improvement for the aromatic $N^b$H and $N^c$ sites, which have much larger quadrupolar coupling constants than $N^a H_3$. The best excitation is obtained by using an 'overtone' DANTE sequence with n=2 pulses per rotor period and k=2 rotor periods, each of duration $\tau_p$=1.1 μs, both for excitation and reconversion.

Although the before described examples concern 14N the same principle can be applied to a large number of other nuclei, e.g., with spin quantum number I=1, such as 14N or 2D, with spin quantum number I=3/2 or 5/2 or 7/2 or with spin quantum number I=½, such as 13C or 15N, in particular comprised in paramagnetic samples, where the spectra of the nuclei of interest are broadened by hyperfine interactions with unpaired electrons.

It has been shown that a train of short rotor-synchronized pulses in the manner of Delays Alternating with Nutations for Tailored Excitation (DANTE) applied to nuclei of interest in samples spinning at the magic angle at high frequencies (e.g., $\nu_{rot}$=62.5 kHz so that $\tau_{rot}$=16 μs) allows one to achieve uniform excitation of a great number of spinning sidebands that arise e.g. from large first-order quadrupole interactions, as occur for aromatic nitrogen-14 nuclei in histidine. With routine rf amplitudes $\omega_1(^{14}N)/(2\pi)$=60 kHz and very short pulses of a typical duration 0.5<$\tau_p$<2 μs, efficient excitation can be achieved with k=13 rotor-synchronized pulses in 13 $\tau_{rot}$=208 μs. Alternatively, with 'overtone' DANTE sequences using n=2, 4, or 8 pulses per rotor period one can also achieve more efficient broadband excitation in fewer rotor periods, typically 2-4 $\tau_{rot}$. These principles can be combined with the indirect detection of $^{14}$N nuclei with I=1 via spy nuclei with S=½ such as 1H or $^{13}$C in the manner of heteronuclear multiple-quantum correlation spectroscopy (HMQC).

There is a considerable advantage in replacing rectangular excitation pulses by rotor-synchronized DANTE sequences. This can be beneficial both for direct excitation of $^{14}$N spectra and for indirect detection via spy nuclei such as $^1$H or $^{13}$C. To limit signal decay, DANTE experiments are best carried out at very high spinning frequencies.

The basic and overtone DANTE schemes presented here may be more broadly applicable to many spinning samples where the breadth of the spectrum is many times larger than both the MAS frequency and the available RE field strength. For half-integer quadrupolar nuclei this may significantly improve the excitation and detection of the satellite transitions. These methods may even be useful for spin ½ nuclei in situations of MAS with spinning frequencies below 30 kHz and RF field strengths below 10 kHz. This may be especially relevant for the case of unpaired electrons in paramagnetic systems undergoing MAS as found in some dynamic nuclear polarization (DNP) experiments. Rotor-synchronized microwave pulses may be useful to manipulate the electron spins for DNP.

REFERENCES

[1] T. Giavani, H. Bildsoe, J. Skibsted, H. J. Jakobsen, *J. Phys. Chem. B* 106 (2002) 3026.
[2] S. Cavadini, S. Antonijevic, A. Lupulescu, G. Bodenhausen, *ChemPhysChem* 8 (2007) 1363.
[3] G. Bodenhausen, R. Freeman, G. A. Morris, *J Magn. Reson.* 23 (1976) 171.
[4] G. A. Morris, R. Freeman, *J Magn. Reson.* 29 (1978) 433.
[5] P. Caravatti, G. Bodenhausen, R. R. Ernst, *J Magn. Reson.* 55 (1983) 88.
[6] S. Cavadini, A. Lupulescu, S. Antonijevic, G. Bodenhausen, *J. Am. Chem. Soc.* 128 (2006) 7706.
[7] Z. Gan, *J. Am. Chem. Soc.* 128 (2006) 6040.
[8] S. Cavadini, S. Antonijevic, A. Lupulescu, G. Bodenhausen, *J. Magn. Reson.* 182 (2006) 168.
[9] S. Cavadini, *Prog. Nucl. Magn. Reson. Spectrosc.* 56 (2010) 46.
[10] Z. Gan, J. P. Amoureux, J. Trebosc, *Chem. Phys. Lett.* 435 (2007) 163.
[11] S. Cavadini, A. Abraham, G. Bodenhausen, *Chem. Phys. Lett.* 445 (2007) 1.
[12] S. Cavadini, V. Vitzthum, S. Ulzega, A. Abraham, G. Bodenhausen, *J. Magn. Reson.* 1 (2010) 57.

We claim:

1. A method for performing magnetic resonance spectroscopy on a solid sample containing nuclei of interest having spin quantum number I, the method comprising the steps of:
   a) subjecting the sample to a static magnetic field;
   b) subjecting the sample to magic angle spinning, thereby averaging out first-order components of second-rank tensor interactions; and
   c) exciting, in a broad-band manner, a transverse magnetization of the nuclei of interest by applying a first train of rotor-synchronized rf-pulses, having a carrier frequency, to the nuclei of interest with a pulse duration $0.1\mu s < \tau_p < 2\mu s$, the first train of rf-pulses comprising k·n pulses extending over k rotor periods $\tau_{rot}$ with n pulses per rotor period $\tau_{rot}$, wherein n is an integer n>1.

2. The method of claim 1, wherein the pulse duration $\tau_p$ is equal for all k·n pulses of the first train of pulses.

3. The method of claim 1, wherein the nuclei of interest are nuclei with a nuclear quadrupolar moment having spin quantum number I=1, 14N nuclei or 2D nuclei.

4. The method of claim 1, wherein the nuclei of interest are quadrupolar nuclei having spin quantum number I=3/2, 5/2 or 7/2.

5. The method of claim 1, wherein the nuclei of interest have spin quantum number I=½, are 13C or are 15N.

6. The method of claim 5, wherein the nuclei of interest are comprised in paramagnetic samples, spectra of the nuclei of interest thereby being broadened by hyperfine interactions with unpaired electrons.

7. The method of claim 1, wherein a reconversion of transverse magnetization into longitudinal magnetization is carried out by applying a second train of short rotor-synchronized rf-pulses, the first train and the second train being separated by a variable evolution interval $t_1$.

8. The method of claim 7, wherein the first and the second train are equal with respect to a number n·k of pulses, a number k of rotor periods, a number n of pulses per rotor period and the pulse duration $\tau_p$.

9. The method of claim 7, wherein excitation of the nuclei of interest by the first train of short rotor-synchronized rf-pulses is carried out subsequent to the following steps:
   a1) exciting transverse magnetization of spy nuclei with spin quantum number S=½; and
   b1) waiting an excitation interval $\tau_{exc}$, either without applying rf-irradiation or with applying a multiple-pulse recoupling sequence to recouple dipolar interactions between the spy nuclei S and the nuclei of interest I, wherein the first train of short rotor-synchronized pulses is applied with a suitable carrier frequency immediately after the excitation interval $\tau_{exc}$.

10. The method of claim 9, wherein, after the second train of rotor-synchronized rf-pulses, reconversion of magnetization of the nuclei of interest I to transverse magnetization of spy nuclei S is achieved during a reconversion interval $\tau_{rec}$.

11. The method of claim 9, wherein the evolution interval $t_1$ is split into two equal intervals by a refocusing 180° pulse applied to S spins of the spy nuclei in order to refocus a frequency offset of the S spins of the spy nuclei with respect to the rf carrier frequency.

12. The method of claim 11, wherein durations of two halves of a split interval $t_1$ are incremented in steps of $\tau_{rot}/2n$ to achieve a greater bandwidth in an indirect dimension and to reduce losses due to signal decay in the interval $t_1$.

13. The method of claim 7, wherein the evolution interval $t_1$ is incremented in a manner of heteronuclear single—or multiple-quantum two-dimensional correlation spectroscopy.

14. The method of claim 1, wherein excitation of the nuclei of interest by the first train of short rotor-synchronized rf-pulses is carried out subsequent to the following steps:
   a1) exciting transverse magnetization of spy nuclei with spin quantum number S=½; and
   b1) waiting an excitation interval $\tau_{exc}$, either without applying rf-irradiation or with applying a multiple-pulse recoupling sequence to recouple dipolar interactions between the spy nuclei S and the nuclei of interest I, wherein the first train of short rotor-synchronized pulses is applied with a suitable carrier frequency immediately after the excitation interval $\tau_{exc}$.

15. The method of claim 14, wherein step a1) comprises cross-polarization from protons to the spy nuclei.

* * * * *